(12) United States Patent
Guidash

(10) Patent No.: US 6,657,665 B1
(45) Date of Patent: Dec. 2, 2003

(54) ACTIVE PIXEL SENSOR WITH WIRED FLOATING DIFFUSIONS AND SHARED AMPLIFIER

(75) Inventor: Robert M. Guidash, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/224,615

(22) Filed: Dec. 31, 1998

(51) Int. Cl.$^7$ .......................... H04N 3/14; H04N 5/335

(52) U.S. Cl. .................................................. 348/308

(58) Field of Search ..................... 257/292; 348/302, 348/308

(56) References Cited

U.S. PATENT DOCUMENTS

| | | | |
|---|---|---|---|
| 5,012,344 A | * 4/1991 | Goto | 348/297 |
| 5,471,515 A | 11/1995 | Fossum et al. | 377/60 |
| 5,587,596 A | 12/1996 | Chi et al. | 257/223 |
| 5,608,243 A | * 3/1997 | Chi et al. | 257/292 |
| 5,625,210 A | 4/1997 | Lee et al. | 257/292 |
| 5,631,704 A | 5/1997 | Dickinson et al. | 348/308 |
| 5,698,844 A | * 12/1997 | Shinohara et al. | 348/300 |
| 5,721,425 A | 2/1998 | Merrill | 250/214.1 |
| 5,760,458 A | 6/1998 | Bergemont et al. | 257/588 |
| 5,786,623 A | 7/1998 | Bergemont et al. | 257/587 |
| 5,789,774 A | 8/1998 | Merrill | 257/292 |
| 5,838,650 A | 11/1998 | Campbell et al. | 369/103 |
| 5,847,422 A | 12/1998 | Chi et al. | 257/291 |
| 5,872,371 A | * 2/1999 | Guidash et al. | 257/292 |
| 6,150,704 A | * 11/2000 | Kozuka | 257/434 |
| 6,184,516 B1 | * 2/2001 | Sawada et al. | 250/214.1 |
| 6,466,266 B1 | * 10/2002 | Guidash et al. | 348/308 |

OTHER PUBLICATIONS

"Active Pixel Sensors: Are CCD's Dinosaurs?" by Eric R. Fossum. Jet Propulsion Laboratory, California Institute of Technology. SPIE vol. 1900, pp. 2–13.

1997 IEEE International Solid–State Circuits Conference. Session 11, Papers FA 11.1–11.5, pp. 180–189 and 452–454.

"Technology and Device Scaling Considerations for CMOS Imagers" by Hon–Sum Wong. IEEE Transactions on Electron Devices, vol. 43, No. 12, Dec. 1996, pp. 2131–2142.

"128×128 CMOS Photodiode–Type Active Pixel Sensor with On–Chip Timing, Control and Signal Chain Electronics" by R.H. Nixon et al. Center for Space Microelectronic Technology, Jet Propulsion Laboratory—California Institute of Technology. SPIE vol. 2415, (1995), pp. 117–123.

"A Small Pixel CMD Image Sensor" by Masanori Ogata et al. IEEE Transactions on Electron Devices, vol. 38, No. 5, May 1991, pp. 1005–1010.

"A 250,000–Pixel Image Sensor with FET Amplification at Each Pixel for High–Speed Television Cameras" by Fumihiko Andoh et al. 1990 IEEE International Solid–State Circuits Conference, pp. 212–213 and 298.

"An 800K–Pixel Color CMOS Sensor for Consumer Still Cameras" by J.E.D. Hurwitz et al. VLSI Vision Ltd. (faxed pp. 2–11).

* cited by examiner

Primary Examiner—Wendy R. Garber
Assistant Examiner—Jason Whipkey
(74) Attorney, Agent, or Firm—Peyton C. Watkins

(57) ABSTRACT

An image sensor having a plurality of pixels arranged in a series of row and columns comprising a semiconductor substrate having a plurality of pixels formed in rows and columns with at least two pixels that each have a voltage to charge conversion region that are spatially isolated from each other and electrically connected to the source of a single reset transistor. The pixels that share a reset transistor can also share an amplifier, and a select electrical function. The preferred embodiment envisions adjacent pixels, although, immediate adjacency is not a requirement.

18 Claims, 6 Drawing Sheets

ACTIVE PIXEL SENSOR WITH WIRED FLOATING DIFFUSIONS AND SHARED AMPLIFIER

FIELD OF THE INVENTION

This invention relates to the field of solid state photosensors and imagers referred to as Active Pixel Sensors (APS) that have active circuit elements associated with each pixel, and more specifically to Solid State Imagers that employ 4 transistor pixels with charge to voltage conversion regions that are isolated from the photodetector and correlated double sampling (CDS).

BACKGROUND OF THE INVENTION

APS are solid state imagers wherein each pixel contains the typical solid state pixel elements including a photosensing means, reset means, a charge to voltage conversion means, a row select means, and additionally all or part of an amplifier. The photocharge collected within the pixel is converted to a corresponding voltage or current within the pixel as discussed in prior art documents such as "Active Pixel Sensors: Are CCD's Dinosaursυ", SPIE Vol. 1900-08-8194-1133 July 1993, by Eric Fossum. APS devices have been operated in a manner where each line or row of the imager is selected and then read out using a column select signal as discussed by E. Fossum in "Active Pixel Sensors: Are CCD's Dinosaursυ", SPIE Vol. 1900-08-8194-1133 July 1993 and by R. H. Nixon, S. E. Kemeny, C. O. Staller, and E. R. Fossum, in "128×128 CMOS Photodiode-type Active Pixel Sensor with On-chip Timing, Control and Signal Chain Electronics". Proceedings of the SPIE vol. 2415, Charge-Coupled Devices and Solid-State Optical Sensors V, paper 34 (1995). The selection of rows and columns within an Active Pixel Sensor is analogous to the selection of words and bits in memory devices. Here, the selection of an entire row would be analogous to selecting a word and the reading out of one of the columns of the Active Pixel Sensor would be analogous to selecting or enabling a single bit line within that word. Conventional prior art active pixel sensor devices teach architectures employing 4 transistor designs, with all 4 transistors contained within each and every pixel. The 4 transistors are typically the Transfer, Row Select, Reset, and Source Follower Amplifier transistors. While this architecture provides the advantages of yielding APS devices having the capability to easily perform CDS and provide low readout noise, these 4T pixels suffer from low fill factor. Fill factor is the percentage of pixel area that is devoted to the photosensor. Since these 4 transistors and their associated contact regions and signal buses are placed in each pixel, and since contact regions typically consume a large amount of pixel area due to the required overlap and spacings of various layers, the fill factor for the pixel is reduced because of the large area consumed that could otherwise be used for the photodetector. Connection to each of these components to the appropriate timing signal is done by metal buses that traverse the entire row of pixels. These metal buses are optically opaque and can occlude regions of the photodetector in order to fit them into the pixel pitch. This also reduces the fill factor of the pixel. Decreasing the fill factor reduces the sensitivity and saturation signal of the sensor. This adversely affects the photographic speed and dynamic range of the sensor, performance measures that are critical to obtaining good image quality.

In U.S. Pat. Nos. 6,160,281 and 6,107,655, Guidash has disclosed pixel architectures that maintain the functionality of prior art 4 transistor pixels by sharing the floating diffusion, row select transistor, reset transistor, and source follower input transistor between pixels of adjacent rows. In these architectures a single floating diffusion region is shared between 2 or 4 adjacent pixels. While this architecture provides high fill factor, it can lead to a physically larger floating diffusion region. This can cause a more non-linear charge to voltage conversion due to the voltage dependent junction capacitance of the floating diffusion being a larger percentage of the total capacitance of the charge to voltage conversion node. It can also lead to less efficient layout of the floating diffusion and reset transistors while trying to maintain identical placement of the photodetector within each pixel. Non-linear charge to voltage conversion can lead to variable color balance artifacts. Non identical placement of the photodetector within each pixel can lead to aliasing artifacts. Both of these artifacts are detrimental to image quality.

A typical prior art Photodiode APS pixel is shown in FIG. 1. The pixel in FIG. 1 is a prior art 4 transistor pixel that comprises: a photodiode (PD), and transfer transistor (TG); floating diffusion (FD); reset transistor with a reset gate (RG); row select transistor with a row select gate, (RSG); and a source follower input signal transistor (SIG). The fill factor of these prior art pixels is typically less than 25%.

Alternate pixel architectures proposed by Guidash are shown in FIGS. 2 and 3. In FIG. 2, 2 row adjacent pixels, Pixel A and Pixel B, have separate photodiodes and transfer gates, PDa, PDb, TGa and TGb respectively, but share all other components, FD, RG, RSG and SIG. In FIG. 3, 4 row and column adjacent pixels, Pixel 1a, 2a, 1b and 2b, where 1 and 2 denote the row, and a or b denote the column, have separate PD's and TG's, PD1a, PD2a, PD1b, PD2b, TG1a, TG2a, TG1b and TG2b, but share all other components FD, RG, RSG and SIG. In this case there are 2 transfer gate buses per row in order to prevent mixing of signal charge from adjacent columns. Although these architectures provide substantially higher fill factor or smaller pixels than the prior art pixel shown in FIG. 1, some disadvantages can ensue as discussed above. It can be seen that by having a single floating diffusion region shared by either 2 adjacent pixels as shown in FIG. 2, or by 4 adjacent pixels as shown in FIG. 3, leads to a physically larger floating diffusion than that obtained in FIG. 1. It is also evident from FIGS. 2 and 3 that the placement of the photodetector within the adjacent pixel boundaries is not identical.

It should be readily apparent that there remains a need within the art to provide an alternate pixel architecture that has a large fill factor, and the capability to perform CDS, like that of the shared amplifier pixels proposed by Guidash, that also have more linear charge to voltage conversion and with identical placement of the photodetector within each pixel.

SUMMARY OF THE INVENTION

The present invention provides a high fill factor Active Pixel Architecture with the capability to perform Correlated Double Sampling, (CDS). The functionality of a four transistor pixel is maintained, the high fill factor of a shared amplifier pixel architecture is maintained while eliminating the need for a single floating diffusion region and the attendant charge to voltage conversion non-linearity and asymmetry of adjacent photodetector placements within the array of pixels.

These and other features are provided by an image sensor having a plurality of pixels arranged in a series of row and columns comprising a semiconductor substrate having a plurality of pixels formed in rows and columns with at least two pixels that each have a charge to voltage conversion region that are spatially isolated from each other and electrically connected to the source of a single reset transistor. The pixels that share a reset transistor can also share an amplifier, and a select electrical function. The preferred embodiment envisions adjacent pixels, although, immediate adjacency is not a requirement.

ADVANTAGEOUS EFFECT OF THE INVENTION

The present invention provides an Active Pixel sensor with true Correlated Double Sampling (CDS). The advantage gained is high fill factor or small pixel, charge to voltage conversion linearity, and identical photodetector placement within each pixel. No disadvantages are foreseen.

DETAILED DESCRIPTION

Figure 4:
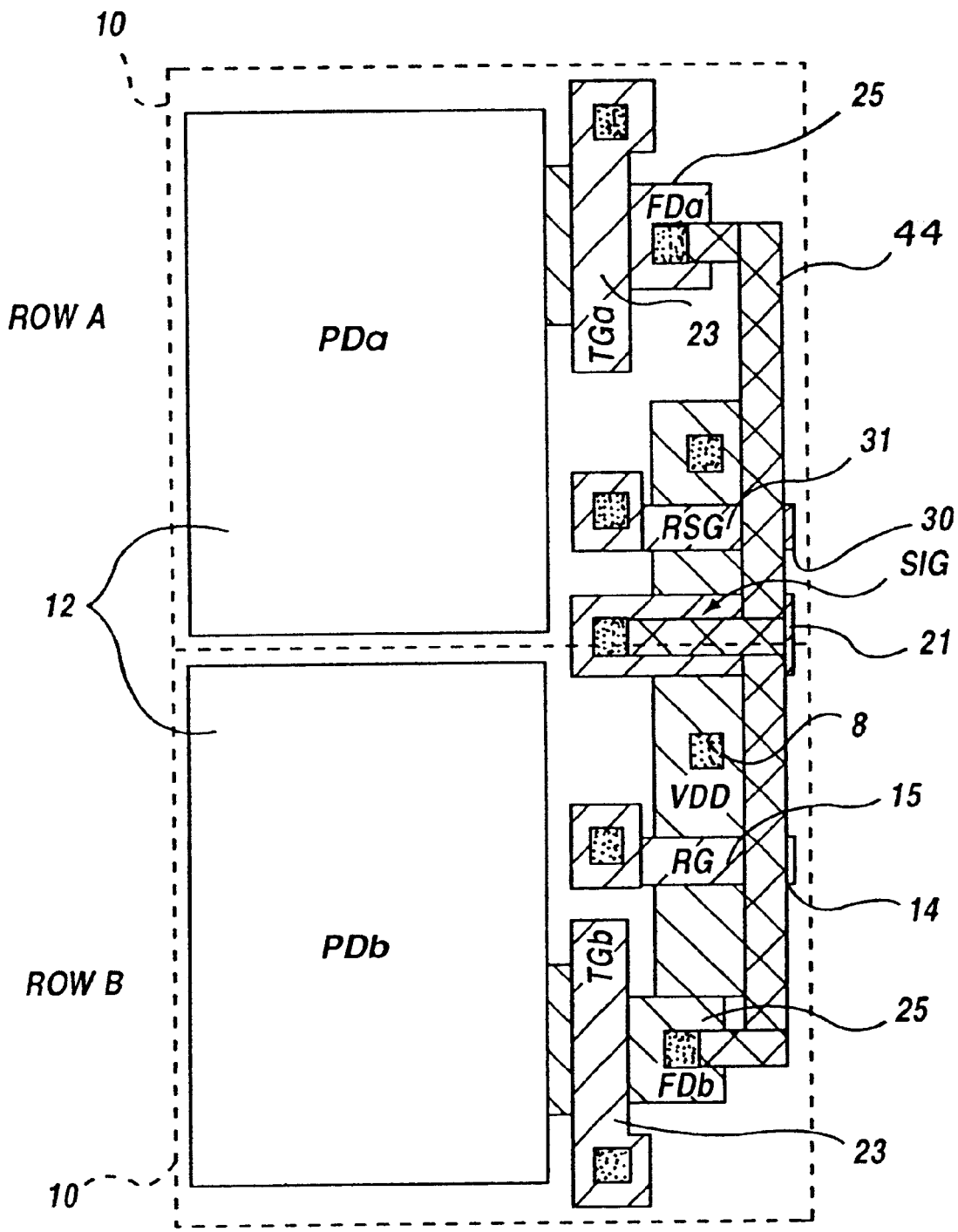
FIG. 4 is a top view layout of 4 adjacent pixels of a new shared amplifier Photodiode pixel architecture for an Active Pixel Sensor
Figure 5:
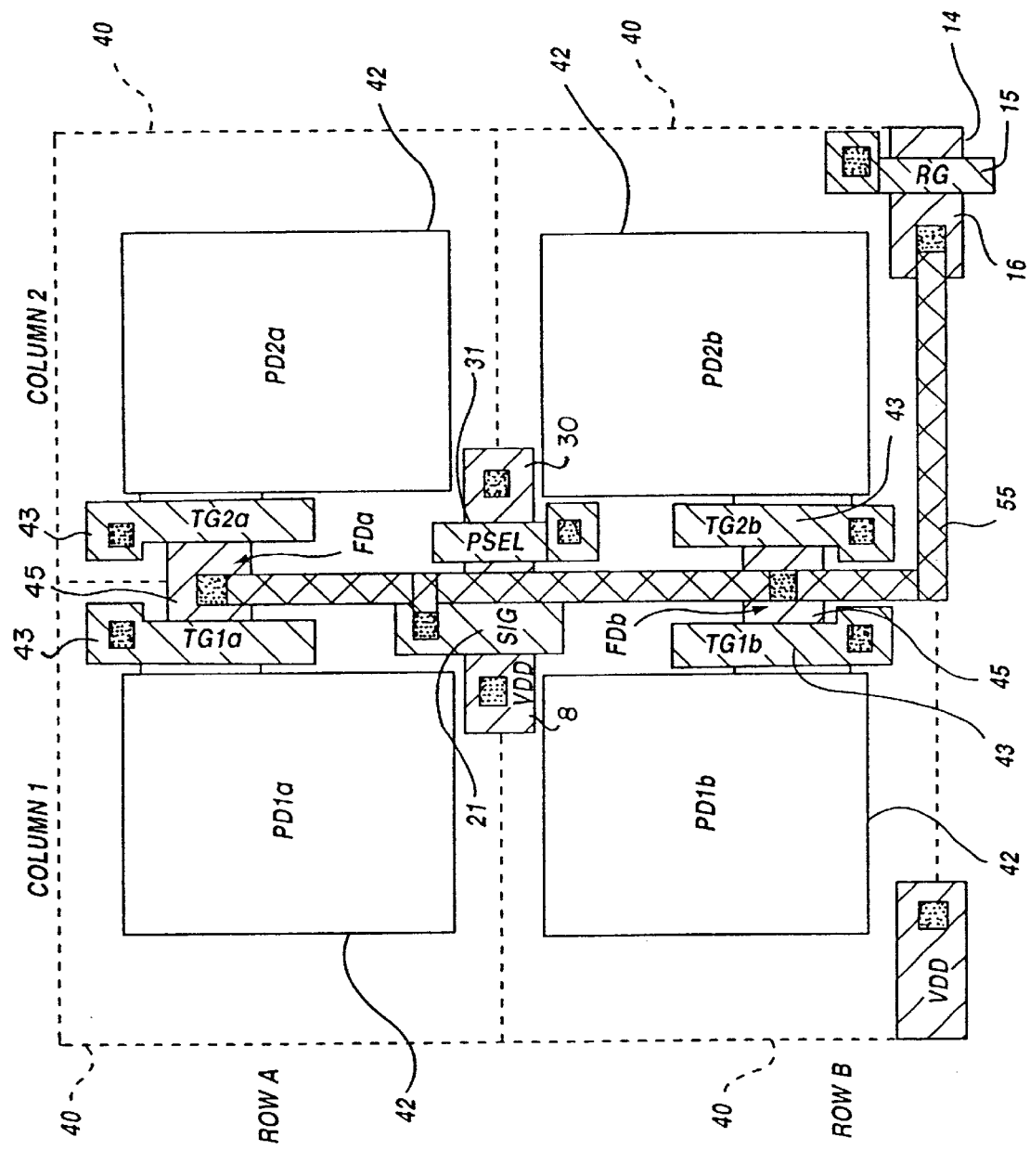
FIG. 5 is top view layout of 4 adjacent pixels of a different embodiment of the new shared amplifier Photodiode pixel architecture for an Active Pixel Sensor.

FIGS. 4 and 5 are a top view layout illustrations of the highly shared amplifier transistor pixel architecture for an Active Pixel Sensor (APS) as envisioned by the present invention. The embodiments shown in FIGS. 4 and 5 envision the best mode known to inventor. Other physical embodiments are realizable that are obvious variations of the embodiments shown in FIGS. 4 and 5 will be discussed further below. The pixel 10 shown in FIG. 4 is single pixel within an array of pixels having numerous rows and columns. Two row adjacent pixels are shown in FIG. 4, indicating how the physically separate floating diffusions in each pixel are interconnected to each other and to the source follower input transistor. The embodiment shown in FIG. 4 is for a photodiode pixel with the amplifier shared between 2 row adjacent pixels. It should be noted that this new architecture can also be used for photogate pixels.

Figure 1:
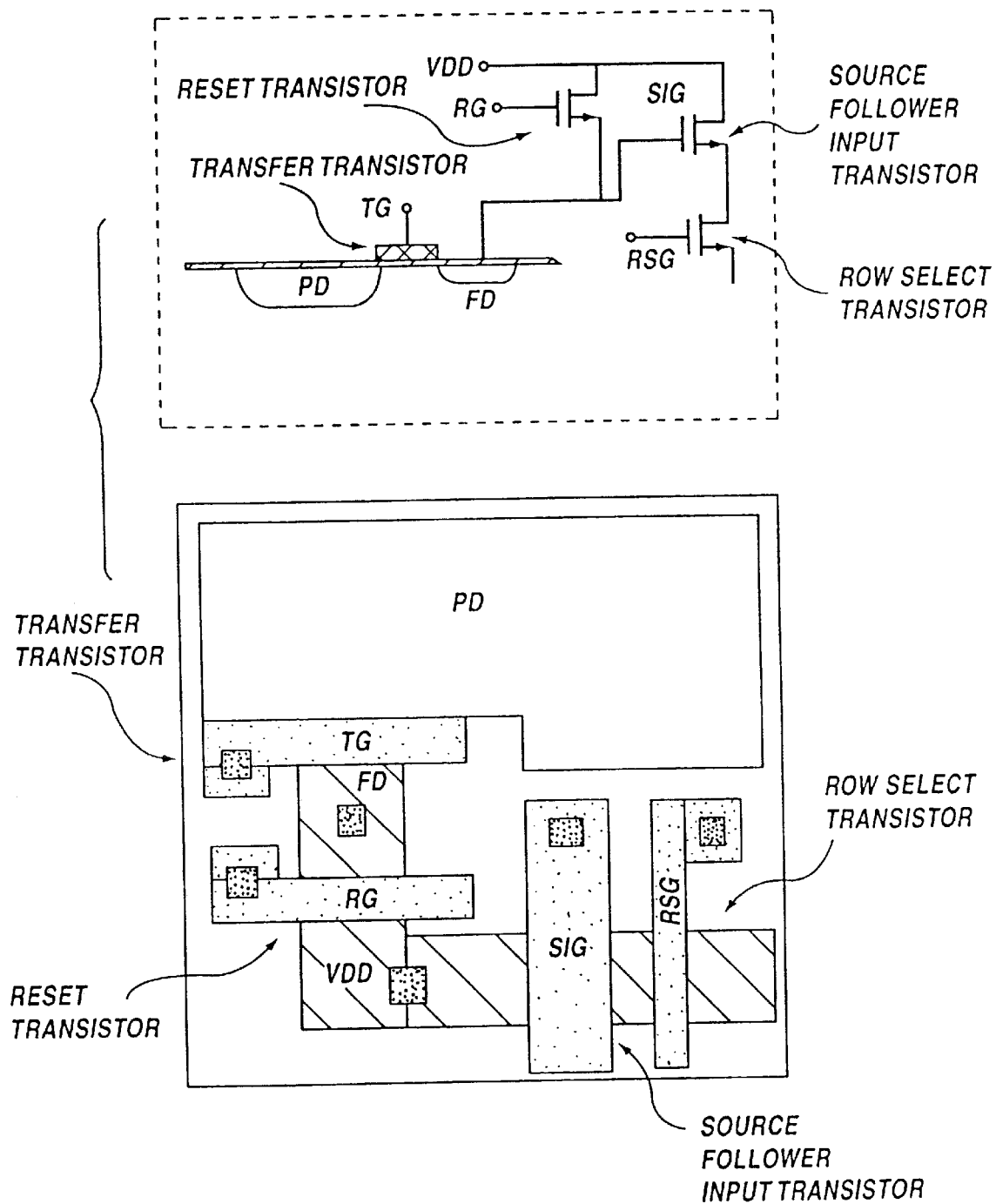
FIG. 1 is a schematic and top view layout of a single pixel of prior art architecture for a four transistor Photodiode Active Pixel Sensor pixel.
Figure 2:
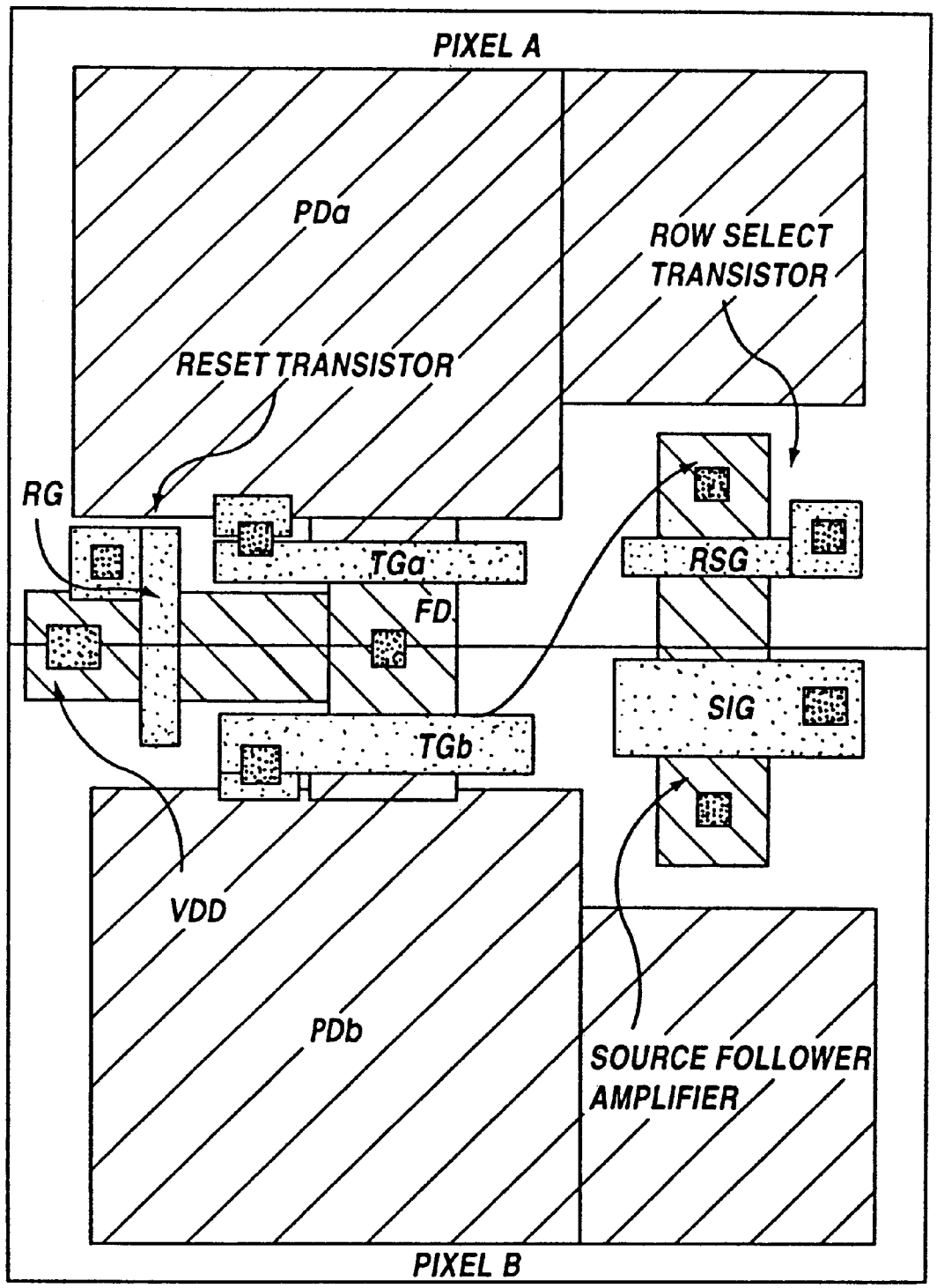
FIG. 2 is a top view layout of two adjacent pixels of a prior art shared amplifier Photodiode pixel architecture for an Active Pixel Sensor.

As seen in FIG. 4, the pixel 10 comprises: photodiode photodetectors 12; transfer gates 23; floating diffusions 25; a reset transistor 14 with a reset gate 15; a source follower input signal transistor 21 (SIG); a voltage supply 8 (VDD) for the reset transistor 14 and source follower input transistor 21; and a row select transistor 30 with a row select gate (RSG) 31. The architecture shown in FIG. 4 is similar to that of the prior art shared amplifier pixel shown in FIG. 2 except that the floating diffusion comprise 2 physically and spatially isolated and separate floating diffusion regions that are electrically shared by the 2 row adjacent pixels. In FIG. 4 the floating diffusions 25, are physically and spatially isolated from each other and are electrically connected to each other and the source follower input transistor 21 by means of a conductive interconnect layer 44 As shown in FIG. 4 the floating diffusion 25, FDb is integrated such that it occupies the area typically occupied by the source 16 of reset transistor 14. Floating diffusion 25, FDa, while on the same electrical node as floating diffusion FDb, is spatially isolated from floating diffusion 25 FDb. Therefore, floating diffusion 25 FDa while on the same electrical node as, floating diffusion 25 FDb, does not serve as the source 16 for the reset transistor 14, while floating diffusion FDb does serve as the source 16 of the reset transistor 14. This is in contrast to the pixel shown in FIG. 2 where the two photodiodes and transfer gates are coupled to a single floating diffusion region. By having 2 physically separate floating diffusion regions that are interconnected allows unrestricted placement of the photodiodes and transfer gates within the pixel boundaries since the transfer gates do not have to transfer the photocharge into the same physical floating diffusion region. This more easily enables identical placement of the photodiodes within the pixel boundaries, thus mitigating possible aliasing artifacts caused by having non-identical placement as shown in FIG. 2. The floating diffusion 25 is still electrically shared since they are wired together to form a single charge to voltage conversion node. When floating diffusion 25 FDb is reset, floating diffusion 25 FDa is also reset to the same potential since they are connected together by the conductive layer 36.

The embodiment shown in FIG. 5 is for the case where 4 row and column adjacent pixels 40 share common components. As seen in FIG. 5, the 4 pixels 40 comprises: photodiode photodetectors 42 (PD1a, PD2a, PD1b, PD2b); transfer gates 43(TG1a, TG2a, TG1b, TG2b); floating diffusions 45 (FDa, FDb); a reset transistor 14 with a reset gate 15 (RG); a source follower input signal transistor 21 (SIG); a voltage supply 8 (VDD) for the reset transistor 14 and source follower input transistor 21; and a row select transistor 30 with a row select gate (RSG) 31. Again, the architecture shown in FIG. 5 is similar to that of the prior art shared amplifier pixel shown in FIG. 3 except that the floating diffusions 45 comprise spatially isolated and separate floating diffusion regions that are electrically connected and shared by the 4 row and column adjacent pixels 40. In FIG. 5 the floating diffusions 45 (FDa, FDb) are physically isolated active area regions that are connected to each other and the source follower input transistor 21 by means of a conductive interconnect layer 55. Neither floating diffusions 45 (FDa, FDb) are integrated as the source 16 of the reset transistor 14. Instead a separate active area region is used as the source 16 of the reset transistor 14, and this region is also connected to floating diffusions 45 (FDa, FDb) and SIG 21 by means of the conductive layer 55.

Figure 3:
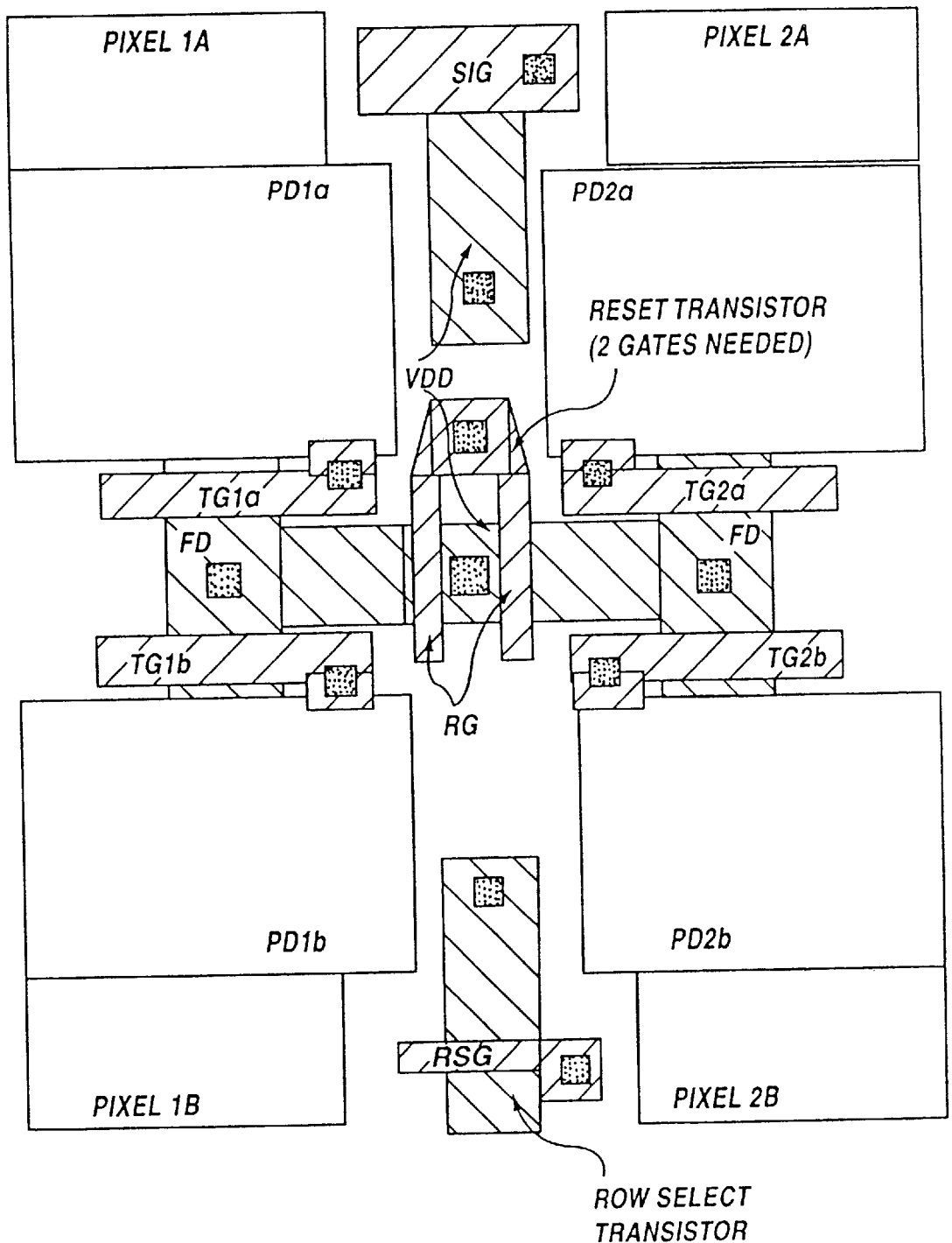
FIG. 3 is a top view layout of 4 adjacent pixels of a prior art shared amplifier Photodiode pixel architecture for an Active Pixel Sensor.

Comparing the architecture and layout of FIG. 5 to that shown in FIG. 3 (where the 4 photodiodes and transfer gates are coupled to a single floating diffusion region), the area of the floating diffusion region is smaller in FIG. 5. As a result, more of the total capacitance of the charge to voltage conversion node in FIG. 5 is comprised of voltage independent capacitances, such as the capacitance of the interconnects. As a result, the charge to voltage conversion will have less variation over the input signal range. Also, similarly to FIG. 4, by having physically separate floating diffusion regions 45 that are electrically interconnected allows unrestricted placement of the photodiodes 42 and transfer gates 43 within the pixel boundaries since the transfer gates 43 do not have to transfer the photocharge into a single floating diffusion region. As seen in FIG. 5 this leads to identical placement of the photodiodes 42 within the pixel boundaries, mitigating possible aliasing artifacts caused by having non-identical placement as shown in FIG. 3. The floating diffusions 45 are still electrically shared since they are wired together to form a single charge to voltage conversion node. When the source 16 of the reset transistor 14 is reset, both floating diffusions 45 (FDa, FDb) are reset to the same potential since they are connected together by the conductive layer 55. When the reset gate 15 is turned off, the source 16 of the reset transistor 14 and the floating diffusions 45 (FDa, FDb) are floating. When charge is transferred from one of the photodiodes 42, the voltage of the floating node will change according to the total capacitance of the interconnected regions.

Figure 6:
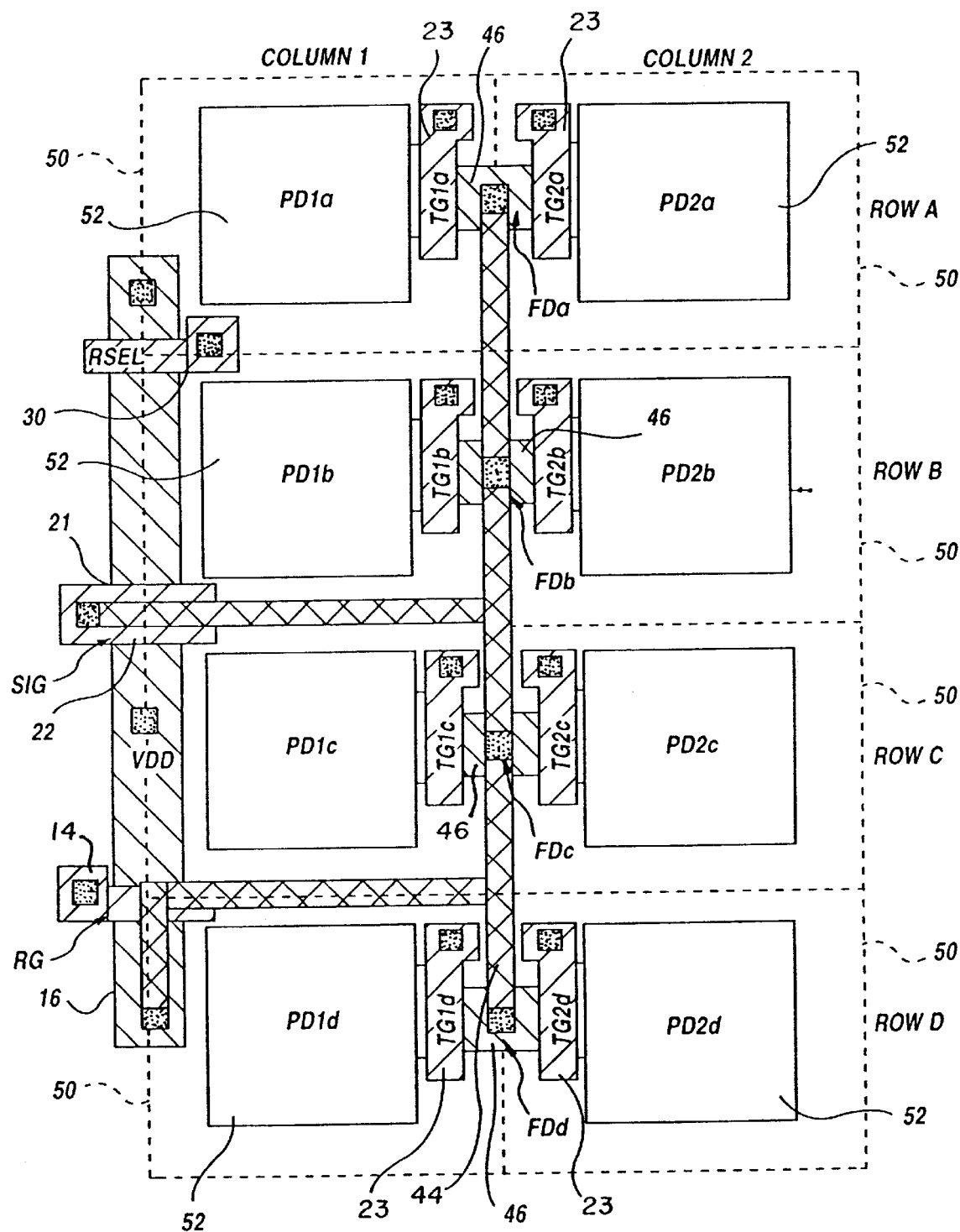
FIG. 6 is top view layout of 8 adjacent pixels of a different embodiment of the new shared amplifier Photodiode pixel architecture for an Active Pixel Sensor.

With this new interconnected floating diffusion region concept, it is now possible to share the active components with more than 4 pixels. This is shown in FIG. 6. In this case the row select transistor 30, reset transistor 14, and source follower input transistor 21 (SIG) are shared between 8 pixels 50. The four spatially isolated floating diffusions 46 (FDa, FDb, FDc and FDd) are wired together and electrically connected to the source 16 of the reset transistor 14 and the gate 22 of the source follower input transistor 21. Again, the floating diffusion 46 area is minimized and identical placement of the photodiodes 52 within each pixel 50 is achieved. Extremely high fill factor can be obtained with this high degree of amplifier sharing since less and less pixel area is now being occupied by components other than the photodetector. The number of pixels sharing a single row select transistor, reset transistor, and source follower input transistor can be arbitrarily extended to any number of rows. It can also be extended to include any number of columns by having additional transfer gate buses per row. As the number of pixels sharing the single set of active components increase, the floating diffusion capacitance increases due to the number of floating diffusion regions connected together and the capacitance of the interconnects. Consequently, there will be some practical limit to the number of pixels sharing the amplifier set by a maximum allowable conversion capacitance or minimum allowable conversion gain.

The foregoing description details the embodiments most preferred by the inventor. Variations of these embodiments will be readily apparent to those skilled in the art. Accordingly, the scope of the invention should be measured by the appended claims.

PARTS LIST

8 VDD
10 pixel
12 photodiode
14 reset transistor
15 reset transistor gate
16 reset transistor source
21 source follower transistor
22 gate of source follower transistor
23 transfer gate
25 floating diffusion
30 row select transistor
31 row select gate
40 pixel
42 photodiode
43 transfer gate
44 interconnect layer
45 floating diffusion
46 floating diffusion
50 pixel
55 interconnect layer

What is claimed is:

1. An image sensor having a plurality of pixels arranged in a series of row and columns comprising:
   a semiconductor material of a first conductivity type;
   at least two adjacent pixels formed within the semiconductor material, each of the pixels having a charge to voltage conversion region operatively coupled to a photodetector such that the charge to voltage conversion regions are spatially isolated from each other; and
   an interconnect layer that permanently shorts together the charge to voltage conversion regions.

2. The image sensor of claim 1 further comprising a single reset transistor operative for the at least two adjacent pixels.

3. The image sensor of claim 2 wherein the source of the reset transistor is spatially isolated from and electrically connected to the charge to voltage conversion regions.

4. The image sensor of claim 1 wherein the at least two adjacent pixels are in different rows but the same columns and share a row select feature.

5. The image sensor of claim 4 wherein the at least two adjacent pixels have independent transfer means for transferring charge to the charge to voltage conversion region from the photodetector.

6. The image sensor of claim 1 wherein the at least two adjacent pixels share an amplifier.

7. The image sensor of claim 1 wherein the at least two adjacent pixels share an amplifier and a row select feature.

8. The image sensor of claim 1 further comprising at least two transfer gate buses for each row of pixels.

9. The image sensor of claim 1 wherein the adjacent pixels are not all abutting each other.

10. An image sensor having a plurality of pixels arranged in a series of row and columns comprising:
    a semiconductor material of a first conductivity type;
    a predetermined subset of pixels comprising at least two pixels formed within the semiconductor material, each of the pixels having a charge to voltage conversion region operatively coupled to a photodetector such that the charge to voltage conversion regions are spatially isolated from each other; and
    an interconnect layer that permanently shorts together the charge to voltage conversion regions.

11. The image sensor of claim 10 further comprising a single reset transistor operative for the pixels.

12. The image sensor of claim 11 wherein the source of the reset transistor is spatially isolated from and electrically connected to the charge to voltage conversion regions.

13. The image sensor of claim 10 wherein the at least two adjacent pixels are in different rows but the same columns and share a row select feature.

14. The image sensor of claim 13 wherein the at least two adjacent pixels have independent transfer means for transferring charge to the charge to voltage conversion region from the photodetector.

15. The image sensor of claim 10 wherein the at least two adjacent pixels share an amplifier.

16. The image sensor of claim 10 wherein the at least two adjacent pixels share an amplifier and a row select feature.

17. The image sensor of claim 10 further comprising at least two transfer gate buses for each row of pixels.

18. The image sensor of claim 10 wherein the adjacent pixels are not all abutting each other.

* * * * *